US008362871B2

(12) United States Patent
Kosowsky et al.

(10) Patent No.: US 8,362,871 B2
(45) Date of Patent: Jan. 29, 2013

(54) GEOMETRIC AND ELECTRIC FIELD CONSIDERATIONS FOR INCLUDING TRANSIENT PROTECTIVE MATERIAL IN SUBSTRATE DEVICES

(75) Inventors: Lex Kosowsky, San Jose, CA (US); Robert Fleming, San Jose, CA (US); Ning Shi, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 246 days.

(21) Appl. No.: 12/607,952

(22) Filed: Oct. 28, 2009

(65) Prior Publication Data

US 2010/0109834 A1    May 6, 2010

Related U.S. Application Data

(60) Provisional application No. 61/111,673, filed on Nov. 5, 2008, provisional application No. 61/140,060, filed on Dec. 22, 2008.

(51) Int. Cl.
*H01C 1/012* (2006.01)
(52) U.S. Cl. .......................... 338/314; 338/13; 338/22 R
(58) Field of Classification Search .................. 338/314, 338/21, 22 R; 361/56, 760, 220, 117, 212; 257/409, 484, 605, 630
See application file for complete search history.

(56) References Cited

U.S. PATENT DOCUMENTS

| 3,347,724 A | 10/1967 | Schneble, Jr. et al. |
| 3,685,026 A | 8/1972 | Wakabayashi et al. |
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,331,948 A | 5/1982 | Malinaric et al. |
| 4,359,414 A | 11/1982 | Mastrangelo |
| 4,405,432 A | 9/1983 | Kosowsky |
| 4,439,809 A | 3/1984 | Weight et al. |
| 4,506,285 A | 3/1985 | Einzinger |
| 4,591,411 A | 5/1986 | Reimann |
| 4,642,160 A | 2/1987 | Burgess |
| 4,702,860 A | 10/1987 | Kinderov et al. |
| 4,726,877 A | 2/1988 | Fryd et al. |
| 4,726,991 A | 2/1988 | Hyatt et al. |
| 4,799,128 A | 1/1989 | Chen |
| 4,888,574 A | 12/1989 | Rice et al. |

(Continued)

FOREIGN PATENT DOCUMENTS

| CH | 663491 A5 | 12/1987 |
| CN | 1783373 A | 6/2006 |

(Continued)

OTHER PUBLICATIONS

U.S. Appl. No. 11/903,820, filed Sep. 24, 2007, Kosowsky et al.

(Continued)

*Primary Examiner* — Kyung Lee
(74) *Attorney, Agent, or Firm* — Mahamedi Paradice Kreisman LLP (57) ABSTRACT

A substrate device includes a layer of non-linear resistive transient protective material and a plurality of conductive elements that form part of a conductive layer. The conductive elements include a pair of electrodes that are spaced by a gap, but which electrically interconnect when the transient protective material is conductive. The substrate includes features to linearize a transient electrical path that is formed across the gap.

10 Claims, 6 Drawing Sheets

U.S. PATENT DOCUMENTS

| | | | |
|---|---|---|---|
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hivley | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 5,986,315 A * | 11/1999 | Bost et al. ............. 257/409 |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A * | 8/2000 | Minervini et al. ......... 361/111 |
| 6,130,459 A | 10/2000 | Intrater | |
| 6,160,695 A | 12/2000 | Winnett et al. | |
| 6,172,590 B1 | 1/2001 | Shrier et al. | |
| 6,184,280 B1 | 2/2001 | Shituba | |
| 6,191,928 B1 | 2/2001 | Rector et al. | |
| 6,198,392 B1 | 3/2001 | Hahn et al. | |
| 6,211,554 B1 * | 4/2001 | Whitney ................. 257/355 |
| 6,239,687 B1 | 5/2001 | Shrier et al. | |
| 6,251,513 B1 | 6/2001 | Rector et al. | |
| 6,310,752 B1 * | 10/2001 | Shrier et al. ............... 361/56 |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski et al. | |
| 6,433,394 B1 | 8/2002 | Intrater | |
| 6,448,900 B1 | 9/2002 | Chen | |
| 6,455,916 B1 | 9/2002 | Robinson | |
| 6,512,458 B1 | 1/2003 | Kobayashi et al. | |
| 6,522,237 B1 * | 2/2003 | Ito et al. .................... 338/22 R |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,741,217 B2 | 5/2004 | Toncich et al. | |
| 6,781,506 B2 * | 8/2004 | Schemenaur et al. ........ 338/307 |
| 6,797,145 B2 | 9/2004 | Kosowsky | |
| 6,882,051 B2 | 4/2005 | Majumdar et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,034,652 B2 | 4/2006 | Whitney et al. | |
| 7,049,926 B2 | 5/2006 | Shrier et al. | |
| 7,053,468 B2 | 5/2006 | Lee | |
| 7,064,353 B2 | 6/2006 | Bhat | |
| 7,132,922 B2 | 11/2006 | Harris et al. | |
| 7,141,184 B2 | 11/2006 | Chacko et al. | |
| 7,173,288 B2 | 2/2007 | Lee et al. | |
| 7,183,891 B2 | 2/2007 | Harris et al. | |
| 7,202,770 B2 | 4/2007 | Harris et al. | |
| 7,205,613 B2 | 4/2007 | Fjelstand et al. | |
| 7,218,492 B2 | 5/2007 | Shrier | |
| 7,320,762 B2 | 1/2008 | Greuter et al. | |
| 7,417,194 B2 | 8/2008 | Shrier | |
| 7,446,030 B2 | 11/2008 | Kosowsky | |
| 7,528,467 B2 | 5/2009 | Lee | |
| 7,593,203 B2 * | 9/2009 | Dudnikov et al. ............... 361/56 |
| 7,612,976 B2 | 11/2009 | Kamath | |
| 7,688,598 B2 * | 3/2010 | Dudnikov et al. ............. 361/760 |
| 2002/0061363 A1 | 5/2002 | Halas et al. | |
| 2003/0008989 A1 | 1/2003 | Gore et al. | |
| 2003/0010960 A1 | 1/2003 | Greuter et al. | |
| 2003/0079910 A1 | 5/2003 | Kosowsky | |
| 2003/0207978 A1 | 11/2003 | Yadav et al. | |
| 2004/0063294 A1 | 4/2004 | Durocher et al. | |
| 2004/0095658 A1 | 5/2004 | Buretea et al. | |
| 2004/0154828 A1 | 8/2004 | Moller et al. | |
| 2004/0160300 A1 | 8/2004 | Shrier | |
| 2004/0211942 A1 | 10/2004 | Clark et al. | |
| 2005/0026334 A1 | 2/2005 | Knall | |
| 2005/0083163 A1 | 4/2005 | Shrier | |
| 2005/0106098 A1 | 5/2005 | Tsang et al. | |
| 2005/0208304 A1 | 9/2005 | Collier et al. | |
| 2005/0218380 A1 | 10/2005 | Gramespacher et al. | |
| 2005/0274455 A1 | 12/2005 | Extrand | |
| 2005/0274956 A1 | 12/2005 | Bhat | |
| 2006/0035081 A1 | 2/2006 | Morita et al. | |
| 2006/0060880 A1 | 3/2006 | Lee et al. | |
| 2006/0152334 A1 | 7/2006 | Maercklein et al. | |

| | | | |
|---|---|---|---|
| 2006/0167139 A1 | 7/2006 | Nelson et al. | |
| 2006/0181826 A1 | 8/2006 | Dudnikov, Jr. et al. | |
| 2006/0181827 A1 | 8/2006 | Dudnikov, Jr. et al. | |
| 2006/0199390 A1 | 9/2006 | Dudnikov, Jr. et al. | |
| 2006/0211837 A1 | 9/2006 | Ko et al. | |
| 2007/0114640 A1 | 5/2007 | Kosowsky | |
| 2007/0116976 A1 | 5/2007 | Tan et al. | |
| 2007/0126018 A1 | 6/2007 | Kosowsky | |
| 2007/0139848 A1 | 6/2007 | Harris et al. | |
| 2007/0146941 A1 | 6/2007 | Harris et al. | |
| 2007/0208243 A1 | 9/2007 | Gabriel et al. | |
| 2008/0023675 A1 | 1/2008 | Kosowsky | |
| 2008/0029405 A1 | 2/2008 | Kosowsky | |
| 2008/0032049 A1 | 2/2008 | Kosowsky | |
| 2008/0035370 A1 | 2/2008 | Kosowsky | |
| 2008/0045770 A1 | 2/2008 | Sigmund et al. | |
| 2008/0073114 A1 | 3/2008 | Kosowsky | |
| 2008/0313576 A1 | 12/2008 | Kosowsky | |
| 2009/0044970 A1 | 2/2009 | Kosowsky | |
| 2009/0050856 A1 | 2/2009 | Kosowsky | |
| 2009/0212266 A1 | 8/2009 | Kosowsky | |
| 2009/0220771 A1 | 9/2009 | Kosowsky | |
| 2009/0242855 A1 | 10/2009 | Kosowsky | |
| 2009/0256669 A1 | 10/2009 | Kosowsky | |
| 2010/0047535 A1 | 2/2010 | Kosowsky et al. | |

FOREIGN PATENT DOCUMENTS

| | | |
|---|---|---|
| CN | 101061617 A | 10/2007 |
| CN | 101116155 | 1/2008 |
| CN | 101226798 | 7/2008 |
| DE | 3040784 A1 | 5/1982 |
| DE | 10115333 A1 | 1/2002 |
| DE | 102004049053 A1 | 5/2005 |
| DE | 102006047377 A1 | 4/2008 |
| EP | 790 758 A1 | 8/1997 |
| EP | 1 003 229 A1 | 5/2000 |
| EP | 1 245 586 A2 | 10/2002 |
| EP | 1 580 809 A2 | 9/2005 |
| EP | 1 542 240 A2 | 6/2006 |
| EP | 1 857 871 A1 | 4/2007 |
| EP | 1 990 834 A2 | 11/2008 |
| JP | 56091464 A | 7/1981 |
| JP | 63 195275 A | 8/1988 |
| JP | 2000 062076 A | 2/2000 |
| WO | WO 88/00526 A1 | 1/1988 |
| WO | WO 96/02922 A2 | 2/1996 |
| WO | WO 96/02924 A1 | 2/1996 |
| WO | WO 96/02944 A1 | 2/1996 |
| WO | WO 97/26665 A1 | 7/1997 |
| WO | WO 98/23018 A1 | 5/1998 |
| WO | WO 99/24992 A1 | 5/1999 |
| WO | WO 99/49525 A1 | 9/1999 |
| WO | WO 02/103085 A1 | 12/2002 |
| WO | WO 2005/100426 A1 | 10/2005 |
| WO | WO 2006/130366 A2 | 12/2006 |
| WO | WO 2007/062170 A2 | 5/2007 |
| WO | WO 2007/062171 A2 | 5/2007 |
| WO | WO 2008/016858 A1 | 2/2008 |
| WO | WO 2008/016859 A1 | 2/2008 |
| WO | WO 2008/024207 A1 | 2/2008 |
| WO | WO 2008/036984 A2 | 3/2008 |
| WO | WO 2008/153584 A1 | 12/2008 |
| WO | WO 2009/026299 A1 | 2/2009 |

OTHER PUBLICATIONS

U.S. Appl. No. 12/714,354, filed Feb. 26, 2010, Fleming et al.
U.S. Appl. No. 12/714,358, filed Feb. 26, 2010, Fleming et al.
U.S. Appl. No. 12/717,102, filed Mar. 3, 2010, Kosowsky et al.
U.S. Appl. No. 12/731,557, filed Mar. 25, 2010, Kosowsky.
Fullerene Chemistry—Wikipedia, http://en.wikipedia.org/wiki/Fullerene/chemistry, 6 pages, printed Apr. 8, 2010.
International Preliminary Report on Patentability for International Application PCT/US2008/073603 mailed Mar. 4, 2010, 7 pages.
International Search Report, Written Opinion and Notice of Transmittal of Same mailed Apr. 16, 2010 for International Application PCT/US2009/062844 20 pages.
International Search Report, Written Opinion and Notice of Transmittal of Same mailed Apr. 20, 2010 for International Application PCT/US2009/059134 22 pages.
International Search Report, Written Opinion, and Notice of Transmittal of same mailed Mar. 18, 2010 for International Application PCT/US2010/021889 15 pages.
Non-Final Office Action mailed Apr. 20, 2010 in U.S. Appl. No. 11/829,946, 20 pages.
Non-Final Office Action dated Apr. 13, 2010 in U.S. Appl. No. 12/714,358, 17 pages.
Non-Final Office Action dated Apr. 13, 2010 in U.S. Appl. No. 12/714,354, 17 pages.
U.S. Appl. No. 11/562,222, filed Nov. 21, 2006, Kosowsky.
U.S. Appl. No. 12/356,490, filed Jan. 20, 2009, Kosowsky.
U.S. Appl. No. 12/370,589, filed Feb. 12, 2009, Kosowsky.
U.S. Appl. No. 12/561,195, filed Sep. 16, 2009, Kosowsky et al.
U.S. Appl. No. 12/571,318, filed Sep. 30, 2009, Kosowsky et al.
U.S. Appl. No. 12/638,360, filed Dec. 15, 2009, Fleming et al.
U.S. Appl. No. 12/638,632, filed Dec. 15, 2009, Fleming et al.
U.S. Appl. No. 12/642,799, filed Dec. 19, 2009, Fleming et al.
U.S. Appl. No. 12/692,573, filed Jan. 22, 2010, Fleming et al.
U.S. Appl. No. 12/703,674, filed Feb. 10, 2010, Kosowsky et al.
U.S. Appl. No. 12/703,701, filed Feb. 10, 2010, Kosowsky et al.
U.S. Appl. No. 12/703,723, filed Feb. 10, 2010, Kosowsky et al.
Breton et al., "Mechanical properties of multiwall carbon nanotubes/epoxy composites: influence of network morphology," Carbon Elsevier UK, vol. 42, No. 5-6, pp. 1027-1030 (2004).
Celzard, A., et al., "Conduction Mechanisms in Some Graphite-polymer Composites: The Effect of a Direct-current Electric Field", Journal of Physics: Condensed Matter, 9 (1997) pp. 2225-2237.
Communication of Nov. 11, 2009 with Examination Report in European Patent Application No. 07 813 509.2 5 pages.
Communication of Nov. 23, 2009 with Supp European Search Report and Opinion, European Application No. 06 838 319.9 7 pages.
Communication of Dec. 23, 2009 in European app. 06838276.1-2203, 6 pgs.
Communication pf Nov. 9, 2009 with Examination Report in European Patent Application No. 07 813 508.4, 5 pages.
Facchetti, Antonio, "Semiconductors for Organic Transistors", Materials Today, vol. 10, No. 3, pp. 28-37.
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability in International Application PCT/US2007/074677, Feb. 3, 2009, 8 pages.
International Preliminary Report on Patentability for International Application PCT/US06/045291, ISA/US, mailed Mar. 24, 2009, 8 pages.
International Preliminary Report on Patentability for International Application PCT/US07/079377 mailed Dec. 30, 2009, 8 pages.
International Search Report and Written Opinion of the International Searching Authority in International Application PCT/US06/45291, United States Patent Office, Mar. 5, 2008, 14 pages.
International Search Report and Written Opinion of the International Searching Authority in International Application PCT/US2007/079377, European Patent Office, Mar. 7, 2008, 13 pages.
International Search Report and Written Opinion of the International Searching Authority in International Application PCT/US2007/074677, European Patent Office, Dec. 5, 2007, 13 pages.
International Search Report and Written Opinion of the International Searching Authority in International Application PCT/US06/45292, United States Patent Office, Feb. 14, 2008, 10 pages.
International Search Report and Written Opinion of the International Searching Authority in International Application PCT/US2008/073603, US Patent Office, Nov. 17, 2008, 7 pages.
International Search Report and Written Opinion mailed Nov. 12, 2009 in International Application PCT/US2009/054062, 15 pages.
International Search Report and Written Opinion in International Application PCT/US2007/079345, mailed Nov. 7, 2008, 25 pages.
International Search Report and Written Opinion mailed Nov. 17, 2009 in International Application PCT/US2009/057209, 14 pages.
International Search Report and Written Opinion in International Application PCT/US2009/038429 mailed Aug. 18, 2009, 20 pgs.

International Search Report and Written Opinion of the International Searching Authority in International Application PCT/US09/040384, European Patent Office, Jul. 2, 2009, 15 pages.

Levinson et al., "The Physics of metal oxide varistors," J. Applied Physics, 46(3): 1332-1341 (1975).

Modine, F.A. and Hyatt, H.M. "New Varistor Material", Journal of Applied Physics, 64 (8), Oct. 15, 1988, pp. 4229-4232.

Notice of Allowance Jan. 14, 2010 U.S. Appl. No. 11/562,289 9pages.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Reese, Colin and Bao, Zhenan, "Organic Single-Crystal Field-Effect Transistors", Materials Today, vol. 10, No. 3, pp. 20-27.

Saunders et al., "Nanoparticle-polymer photovoltaic cells," Adv. Colloid Int. Sci., vol. 138, No. 1, pp. 1-23 (2007).

Non-Final Office Action mailed Jul. 31, 2012, issued in U.S. Appl. No. 12/541,963.

Translation of Office Action of Jul. 2, 2012 in Chinese App. No. 200980150252.X.

Translation of Office Action issued Jul. 24, 2012, in Japanese Application No. 2011-505116.

Office Action dated Jul. 2, 2012, issued in Taiwanese Application No. 098128085.

Translation of Office Action dated Aug. 23, 2012, in Korean Application No. 2011-7006591.

Office Action issued Sep. 4, 2012 for Taiwan Application No. 098137111.

English Translation of the Office Action issued Sep. 4, 2012 for Taiwan Application No. 098137111.

* cited by examiner

GEOMETRIC AND ELECTRIC FIELD CONSIDERATIONS FOR INCLUDING TRANSIENT PROTECTIVE MATERIAL IN SUBSTRATE DEVICES

RELATED APPLICATIONS

This application claims benefit of priority to: Provisional U.S. Patent Application No. 61/111,673, Nov. 5, 2008 entitled GEOMETRIC CONFIGURATIONS OF LAYERS FORMING SUBSTRATE DEVICE WITH INTEGRATED TRANSIENT PROTECTIVE LAYER; and Provisional U.S. Patent Application No. 61/140,060, Dec. 22, 2008 entitled SUBSTRATE DEVICE HAVING SHAPED OR REDUCED CONTACT BETWEEN PROTECTIVE VSD LAYER AND ELECTRICAL CONTACTS; both of the aforementioned priority application being hereby incorporated by reference in their entirety.

TECHNICAL FIELD

Embodiments described herein pertain generally to substrate devices, and more specifically to substrate devices that include transient protective material to protect against electrical events.

BACKGROUND

Voltage switchable dielectric (VSD) materials are materials that are insulative at low voltages and conductive at higher voltages. These materials are typically composites comprising of conductive, semiconductive, and insulative particles in an insulative polymer matrix. These materials are used for transient protection of electronic devices, most notably electrostatic discharge protection (ESD) and electrical overstress (EOS). Generally, VSD material behaves as a dielectric, unless a characteristic voltage or voltage range is applied, in which case it behaves as a conductor. Various kinds of VSD material exist. Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein.

VSD materials may be formed in using various processes. One conventional technique provides that a layer of polymer is filled with high levels of metal particles to very near the percolation threshold, typically more than 20% by volume. Semiconductor and/or insulator materials is then added to the mixture.

Another conventional technique provides for forming VSD material by mixing doped metal oxide powders, then sintering the powders to make particles with grain boundaries, and then adding the particles to a polymer matrix to above the percolation threshold.

Other techniques for forming VSD material are described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES.

DETAILED DESCRIPTION

Numerous embodiments are provided herein that encompass substrate devices having (i) integrated layers of transient protective material, and (ii) layers, structural elements and/or features that are designed to increase electric field uniformity when the transient protective materials are used to handle transient electrical events.

According to embodiments, the transient protective material may have non-linear resistive characteristics in that the transient protective material is (i) substantially non-conductive in absence of a voltage that exceeds a characteristic trigger voltage of the material, and (ii) conductive when a voltage that exceeds the characteristic trigger voltage is applied to the transient protective material. In a non-conductive state, the transient protective material behaves substantially as an electrical insulator or non-conductor, with exception that in some instances, a relatively small leakage current (e.g. of the level of microamps or nanoamps) may be induced from the material when a voltage is applied. In the conductive state, the transient protective material behaves as a conductor, in that it freely conducts current while the transient voltage is present. In general, non-linear resistive material does not obey Ohm's law in that it can have both conductive and non-conductive states, depending on the presence of a sufficient transient voltage or electrical event. Such non-linear resistive transient protective material include compositions of voltage switchable dielectric (VSD) material and/or varistor material. Numerous compositions of non-linear resistive transient protective material, including VSD material are provided below. According to some embodiments, non-linear resistive transient protective material is integrated into a substrate device, such as a core layer structure, in order to protect electrical elements (e.g. electrodes forming conductive paths, discrete components etc.) that are subsequently formed on that device from ESD, EOS or other electrical events. The integration of transient protective material in the substrate device include provisions for protecting the transient protective material and components of the substrate device from the occurrence of non-uniform electric field distribution when the transient protective material is switched into a conductive state.

According to one or more embodiments, a substrate device includes a layer of transient protective material and a plurality of conductive elements that form part of a conductive layer. The conductive elements include a pair of electrodes that are spaced by a gap, but which electrically interconnect when the transient protective material is conductive. The substrate includes features to linearize a transient electrical path that is formed across the gap. Such features include, for example, structural variations to one or both electrodes, use of additional layers, or alternatively spaced conductive elements.

Overview of VSD Material

As used herein, "voltage switchable material" or "VSD material" is any composition, or combination of compositions, that has a characteristic of being dielectric or non-conductive, unless a field or voltage is applied to the material that exceeds a characteristic level of the material, in which case the material becomes conductive. Thus, VSD material is a dielectric or non-conductive unless voltage (or field) exceeding the characteristic level (e.g. such as provided by ESD events) is applied to the material, in which case the VSD material is switched into a conductive state. VSD material can further be characterized as a nonlinear resistance material. With an embodiment such as described, the characteristic voltage may range in values that exceed the operational voltage levels of the circuit or device several times over. Such voltage levels may be of the order of transient conditions, such as produced by electrostatic discharge, although embodiments may include use of planned electrical events. Furthermore, one or more embodiments provide that in the absence of the voltage exceeding the characteristic voltage, the material behaves similar to the binder.

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

Many compositions of VSD material provide desired 'voltage switchable' electrical characteristics by dispersing a quantity of conductive materials in a polymer matrix to just below the percolation threshold, where the percolation threshold is defined statistically as the threshold by which a continuous conduction path is likely formed across a thickness of the material. Other materials, such as insulators or semiconductors, may be dispersed in the matrix to better control the percolation threshold. Still further, other compositions of VSD material, including some that include particle constituents such as core shell particles, enable the total particle constituency above the VSD material to be loaded above the percolation threshold. As described by embodiments, the VSD material may be situated on an electrical device in order to protect a circuit or electrical component of device (or specific sub-region of the device) from electrical events, such as ESD or EOS. Accordingly, one or more embodiments provide that VSD material has a characteristic voltage level that exceeds that of an operating circuit or component of the device.

According to embodiments described herein, the constituents of VSD material may be uniformly mixed into a binder or polymer matrix. In one embodiment, the mixture is dispersed at nanoscale, meaning the particles that comprise the organic conductive/semi-conductive material are nano-scale in at least one dimension (e.g. cross-section) and a substantial number of the particles that comprise the overall dispersed quantity in the volume are individually separated (so as to not be agglomerated or compacted together).

Still further, an electronic device may be provided with VSD material in accordance with any of the embodiments described herein. Such electrical devices may include substrate devices, such as printed circuit boards, semiconductor packages, discrete devices, Light Emitting Diodes (LEDs), and radio-frequency (RF) components.

Figure 1:
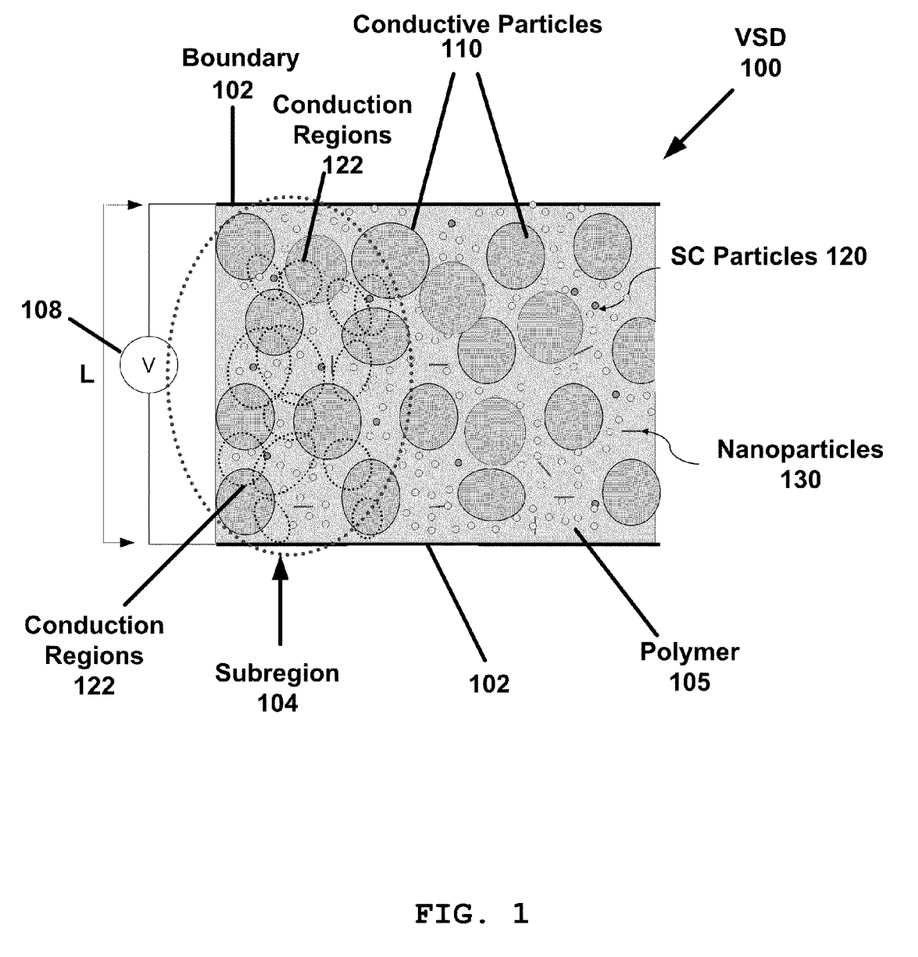
FIG. 1 is an illustrative (not to scale) sectional view of a layer or thickness of voltage switchable dielectric (VSD) material, depicting the constituents of VSD material in accordance with various embodiments.

FIG. 1 is an illustrative (not to scale) sectional view of a layer or thickness of VSD material, depicting the constituents of VSD material in accordance with various embodiments. As depicted, VSD material 100 includes matrix binder 105 and various types of particle constituents, dispersed in the binder in various concentrations. The particle constituents of the VSD material may include a combination of conductive particles 110, semiconductor particles 120, nano-dimensioned particles 130 and/or other types of particles that facilitate or promote, for example, desired electrical or physical properties and/or particle loading levels. As an alternative or variation, the VSD composition may omit the use of conductive particles 110, semiconductive particles 120, or nano-dimensioned particles 130. Thus, the type of particle constituent that are included in the VSD composition may vary, depending on the desired electrical and physical characteristics of the VSD material. For example, some VSD compositions may include conductive particles 110, but not semiconductive particles 120 and/or nano-dimensioned particles 130. Still further, other embodiments may omit use of conductive particles 110 in place of other types of particles, such as varistors (not shown) or core-shelled particles.

Examples for matrix binder 105 include polyethylenes, silicones, acrylates, polymides, polyurethanes, epoxies, polyamides, polycarbonates, polysulfones, polyketones, and copolymers, and/or blends thereof.

Examples of conductive materials 110 include metals such as copper, aluminum, nickel, silver, gold, titanium, stainless steel, nickel phosphorus, niobium, tungsten, chrome, other metal alloys, or conductive ceramics like titanium diboride or titanium nitride. Examples of semiconductive material 120 include both organic and inorganic semiconductors. Some inorganic semiconductors include, silicon carbide, Boron-nitride, aluminum nitride, nickel oxide, zinc oxide, zinc sulfide, bismuth oxide, titanium dioxide, cerium oxide, bismuth oxide, in oxide, indium in oxide, antimony in oxide, and iron oxide, praseodynium oxide. The specific formulation and composition may be selected for mechanical and electrical properties that best suit the particular application of the VSD material. The nano-dimensioned particles 130 may be of one or more types. Depending on the implementation, at least one constituent that comprises a portion of the nano-dimensioned particles 130 are (i) organic particles (e.g. carbon nanotubes, graphenes); or (ii) inorganic particles (metallic, metal oxide, nanorods, or nanowires). The nano-dimensioned particles may have high-aspect ratios (HAR), so as to have aspect ratios that exceed at least 10:1 (and may exceed 1000:1 or more). The particle constituents may be uniformly dispersed in the polymer matrix or binder at various concentrations. Specific examples of such particles include copper, nickel, gold, silver, cobalt, zinc oxide, in oxide, silicon carbide, gallium arsenide, aluminum oxide, aluminum nitride, titanium dioxide, antimony, Boron-nitride, in oxide, indium in oxide, indium zinc oxide, bismuth oxide, cerium oxide, and antimony zinc oxide.

The dispersion of the various classes of particles in the matrix 105 may be such that the VSD material 100 is non-layered and uniform in its composition, while exhibiting electrical characteristics of voltage switchable dielectric material. Generally, the characteristic voltage of VSD material is measured at volts/length (e.g. per 5 mil), although other field measurements may be used as an alternative to voltage. Accordingly, a voltage 108 applied across the boundaries 102 of the VSD material layer may switch the VSD material 100 into a conductive state if the voltage exceeds the characteristic voltage for the gap distance L.

As depicted by a sub-region 104 (which is intended to be representative of the VSD material 100), VSD material 100 comprises particle constituents that individually carry charge when voltage or field acts on the VSD composition. If the field/voltage is above the trigger threshold, sufficient charge is carried by at least some types of particles to switch at least a portion of the VSD composition 100 into a conductive state. More specifically, as shown for representative sub-region 104, individual particles (of types such as conductor particles, core shell particles or semiconductive or compound particles) acquire conduction regions 122 in the polymer binder 105 when a voltage or field is present. The voltage or field level at which the conduction regions 122 are sufficient in magnitude and quantity to result in current passing through a thickness of the VSD material 100 (e.g. between boundaries 102) coincides with the characteristic trigger voltage of the composition. FIG. 1 illustrates presence of conduction regions 122 in a portion of the overall thickness. The portion or thickness of the VSD material 100 provided between the boundaries 102 may be representative of the separation between lateral or vertically displaced electrodes. When voltage is present, some or all of the portion of VSD material can be affected to increase the magnitude or count of the conduction regions in that region. When voltage is applied, the presence of conduction regions may vary across the thickness (either vertical or lateral thickness) of the VSD composition, depending on, for example, the location and magnitude of the voltage of the event. For example, only a portion of the VSD material may pulse, depending on voltage and power levels of the electrical event.

Accordingly, FIG. 1 illustrates that the electrical characteristics of the VSD composition, such as conductivity or trigger voltage, may be affected in part by (i) the concentration of particles, such as conductive particles, nanoparticles (e.g. HAR particles), varistor particles, and/or core shell particles; (ii) electrical and physical characteristics of the particles, including resistive characteristics (which are affected by the type of particles, such as whether the particles are core shelled or conductors); and (iii) electrical characteristics of the polymer or binder.

Specific compositions and techniques by which organic and/or HAR particles are incorporated into the composition of VSD material is described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES; both of the aforementioned patent applications are incorporated by reference in their respective entirety by this application.

Some embodiments may provide for VSD material that includes varistor particles as a portion of its particle constituents. Embodiments may incorporate a concentration of particles that individually exhibit non-linear resistive properties, so as to be considered active varistor particles. Such particles typically comprise zinc oxide, titanium dioxide, Bismuth oxide, Indium oxide, in oxide, nickel oxide, copper oxide, silver oxide, praseodymium oxide, Tungsten oxide, and/or antimony oxide. Such a concentration of varistor particles may be formed from sintering the varistor particles (e.g. zinc oxide) and then mixing the sintered particles into the VSD composition. In some applications, the varistor particle compounds are formed from a combination of major components and minor components, where the major components are zinc oxide or titanium dioxide, and the minor components or other metal oxides (such as listed above) that melt of diffuse to the grain boundary of the major component through a process such as sintering.

The particle loading level of VSD material can be varied above or below the percolation threshold, depending on the electrical or physical characteristics of one or more of the particle constituents that comprise the VSD material. Particles with high bandgap (e.g. using insulative shell layer(s)) may be used to enable the VSD composition to exceed the percolation threshold. Accordingly, in some compositions (such as those that incorporate high bandgap particles), the total particle concentration of the VSD material exceeds the percolation threshold of the composition.

Under some conventional approaches, the composition of VSD material has included metal or conductive particles that are dispersed in the binder of the VSD material. The metal particles may range in size and quantity, depending in some cases on desired electrical characteristics for the VSD material. In particular, metal particles may be selected to have characteristics that affect a particular electrical characteristic. For example, to obtain lower clamp value (e.g. an amount of applied voltage required to enable VSD material to be conductive), the composition of VSD material may include a relatively higher volume fraction of metal particles. As a result, it becomes difficult to maintain a low initial leakage current (or high resistance) at low biases due to the formation of conductive paths (shorting) by the metal particles.

VSD Material Applications

Numerous applications exist for compositions of VSD material in accordance with any of the embodiments described herein. In particular, embodiments provide for VSD material to be provided on substrate devices, such as printed circuit boards, semiconductor packages, discrete devices, thin film electronics, as well as more specific applications such as LEDs and radio-frequency devices (e.g. RFID tags). Still further, other applications may provide for use of VSD material such as described herein with a liquid crystal display, organic light emissive display, electrochromic display, electrophoretic display, or back plane driver for such devices. The purpose for including the VSD material may be to enhance handling of transient and overvoltage conditions, such as may arise with ESD events. Another application for VSD material includes metal deposition, as described in U.S. Pat. No. 6,797,125 to L. Kosowsky (which is hereby incorporated by reference in its entirety).

Figure 2A:
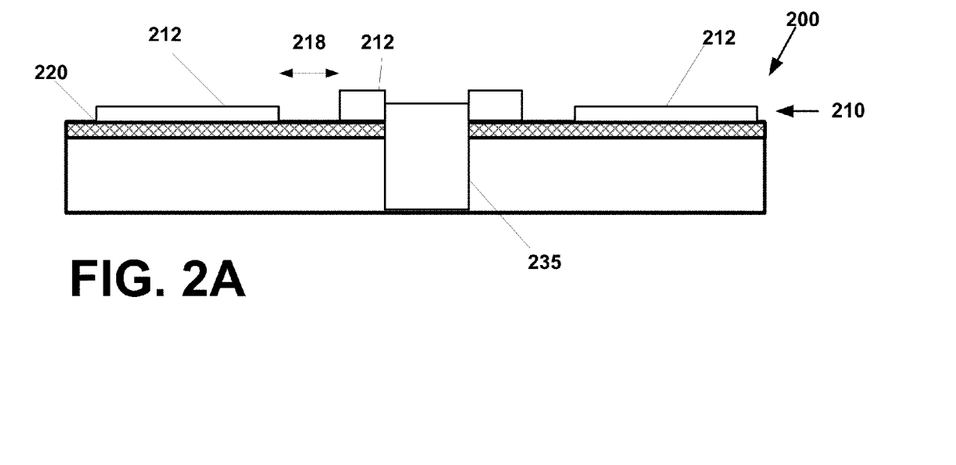
FIG. 2A illustrates a substrate device that is configured with VSD material having a composition such as described with any of the embodiments provided herein.

FIG. 2A illustrates a substrate device that is configured with VSD material having a composition such as described with any of the embodiments provided herein. As shown by FIG. 2A, the substrate device 200 corresponds to, for example, a printed circuit board. A conductive layer 210 comprising electrodes 212 and other trace elements or interconnects is formed on a thickness of surface of the substrate 200. In a configuration as shown, VSD material 220 (having a composition such as described with any of the embodiments described herein) may be provided on substrate 200 (e.g. as part of a core layer structure) in order provide, in presence of a suitable electrical event (e.g. ESD), a lateral switch between electrodes 212 that overlay the VSD layer 220. The gap 218 between the electrode 212 acts as a lateral or horizontal switch that is triggered 'on' when a sufficient transient electrical event takes place. In one application, one of the electrodes 212 is a ground element that extends to a ground plane or device. The grounding electrode 212 interconnects other conductive elements 212 that are separated by gap 218 to ground as a result of material in the VSD layer 220 being switched into the conductive state (as a result of the transient electrical event).

In one implementation, a via 235 extends from the grounding electrode 212 into the thickness of the substrate 200. The via provides electrical connectivity to complete the ground path that extends from the grounding electrode 212. The portion of the VSD layer that underlies the gap 218 bridges the conductive elements 212, so that the transient electrical event is grounded, thus protecting components and devices that are interconnected to conductive elements 212 that comprise the conductive layer 210.

Figure 2B:
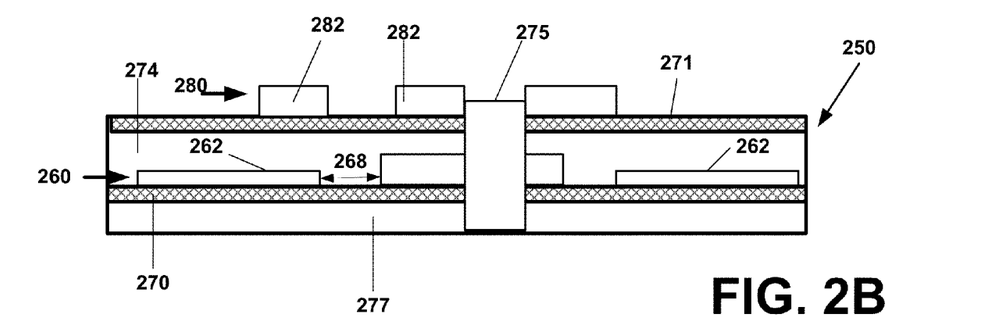
FIG. 2B illustrates a configuration in which a conductive layer is embedded in a substrate.

FIG. 2B illustrates a configuration in which a conductive layer is embedded in a substrate. In a configuration shown, a conductive layer 260 comprising electrodes 262, 262 is distributed within a thickness of a substrate 250. A layer of VSD material 270 and dielectric material 274 (e.g. B-stage material) may overlay the embedded conductive layer. Additional layers of dielectric material 277 may also be included, such as directly underneath or in contact with the VSD layer 270. Surface electrodes 282, 282 comprise a conductive layer 280 provided on a surface of the substrate 250. The surface electrodes 282, 282 may also overlay a layer VSD material 271. One or more vias 275 may electrically interconnect electrodes/conductive elements of conductive layers 260, 280. The layers of VSD material 270, 271 are positioned so as to horizontally switch and bridge adjacent electrodes across a gap 268 of respective conductive layers 260, 280 when transient electrical events of sufficient magnitude reach the VSD material.

Figure 2C:
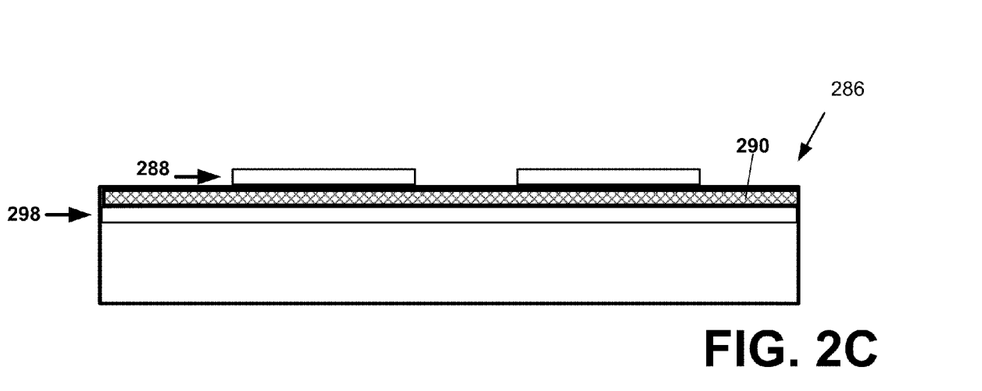
FIG. 2C illustrates a vertical switching arrangement for incorporating VSD material into a substrate.

As an alternative or variation, FIG. 2C illustrates a vertical switching arrangement for incorporating VSD material into a substrate. A substrate 286 incorporates a layer of VSD material 290 that separates two layers of conductive material 288, 298. In one implementation, one of the conductive layers 298 is embedded. When a transient electrical event reaches the layer of VSD material 290, it switches conductive and bridges the conductive layers 288, 298. The vertical switching configuration may also be used to interconnect conductive elements to ground. For example, the embedded conductive layer 298 may provide a grounding plane.

Electrode Structure to Reduce Unwanted Electric Field Characteristics

Figure 3:
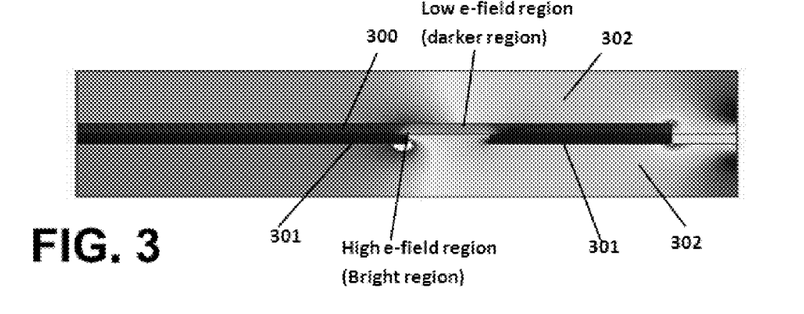
FIG. 3 is a representation of electric field distribution for two electrodes that are physically separated, but bridged to electrically connect across the separation by an underlying or overlaid layer of VSD material that switches into a conductive state (as a result of a transient electrical event).

FIG. 3 is a representation of electric field distribution for two electrodes that are physically separated, but bridged to electrically connect across the separation by an underlying or overlaid layer of VSD material that switches into a conductive state (as a result of a transient electrical event). The VSD material 300 provided between the dielectric layer 302 and the conductive layer 301, and will switch upon occurrence of high voltage transient stresses. As a comparison to a configuration shown in FIG. 2A, an electric field distribution may result when, for example, the material from the VSD layer 220 of substrate 200 switches to interconnect electrodes 212, 212 across the gap 218. Such horizontal switching arrangements create a non-uniform electric field distribution inside VSD layer 220 when a transient electrical event occurs.

With further reference to FIG. 3, the electric field distribution in the VSD material is made more non-uniform in part by the conductive path (resulting from the transient event switching the VSD material into the conductive state) being arced or non-linear, as a result of the disparity in height between the electrodes of the conductive layer 301 and the VSD layer 300. In the vertical direction, the electric field in VSD layer 300 decreases from highest value at the regions close to the conductive layer to lower value at regions far away from the conductive layers, as the conductive layer consisted of electrodes 301 positioned on the VSD layer 300. The decreasing electric field distribution in VSD layer 300, in relation to the proximity of the conductive layer 301, constitutes a non-uniform electric field that varies in the vertical direction of PCB. The electric field is shown by the shade (representing color) changes from brightness to darkness. In the horizontal direction, the electric field inside VSD layer 300 at the regions close to the electrodes is much higher than the regions in the center of VSD layer 300 as shown by the brightness. Thus for example, in an arrangement such as shown by FIG. 2A, in which gap 218 separates adjacent electrodes 212 (pad and antipad), an electric field (shown by shading/color) is significantly high (darker regions) at the regions close to the corners or edges of the individual electrodes. The presence of via 235 may further affect the non-uniformity of the electric field.

Accordingly, embodiments recognize that a transient over-current surge may be distributed significantly different at various regions of the substrate. The large current density flow in the area near the via pad and via antipad results in significant higher heating in contrast to other regions. This disparity of current flow causes larger degradation of transient materials in these regions.

Embodiments further recognize that when VSD material is used on a substrate in a horizontal switching configuration, non-uniformity in the electric field distribution is lessened by reducing or linearizing the arc of the transient electrical path across the gap 218 (see e.g. FIG. 2A). Specifically, a shortened and/or more linear path can uniformize (or reduce non-uniformity) in the electric field distribution.

Figure 4A:
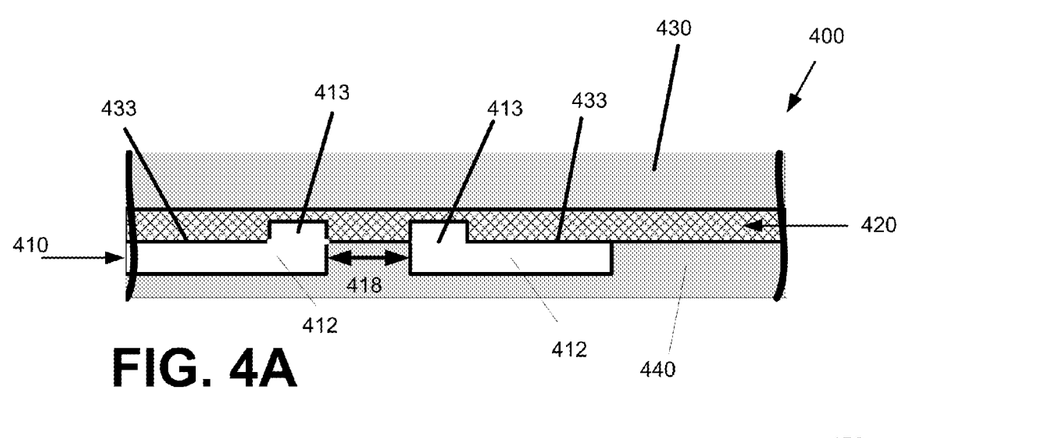
FIG. 4A illustrates a substrate having individual electrodes that include raised structures or formations to facilitate horizontal or lateral switching across a gap that is bridged by VSD material, according to an embodiment.

FIG. 4A illustrates a substrate having individual electrodes that include raised structures or formations to facilitate horizontal or lateral switching across a gap that is bridged by VSD material, according to one or more embodiments. In the configuration shown by FIG. 4A, a conductive layer 410 is embedded in the substrate 400 (e.g. a core layer structure), similar to that shown with FIG. 2B. A layer of VSD material 420 directly overlays the conductive layer. A dielectric layer 430 (e.g. B-Stage material) overlays the layer VSD material 420. In an implementation shown, an additional dielectric layer 440 underlies the conductive layer 410. Adjacent electrodes 412 of the conductive layer 410 may be separated by a gap 418, and VSD material 420 bridges the gap when switched on by a transient electrical event. Additionally, the electrodes 412 of the conductive layer include raised structures 413 that extend a thickness upward into the layer of VSD material 420. The presence of the raised structures 413 on adjacent electrodes provides that, in the event of a transient event, the transient electrical path across the gap is more linear. The raised structures 413 may be of any general shape, such as provided by a bump, contoured or angular. The position of the raised structures 413 is preferably at or near the edge of the respective electrode 412, so as to abut the boundaries of gap 418.

In an embodiment such as shown by FIG. 4A, the conductive layer can be selectively deposited in the core layer structure to form the raised structures 413 of individual electrodes 412, 412 in the conductive layer 410. For example, the conductive layers may be selectively formed by techniques that include: (i) screen-printing, (ii) slot coating, (iii) inkjet printing, or (iv) pattern spraying, with one side bonded with the conductive layer and the opposing side bonded with transient protective material.

In one implementation, the raised structure can be implemented by pattern plating. Specifically, the conductive layer 410 can be bonded to the dielectric layer 430 and selectively masked by dry film image pattern. The copper build up pattern plating is then applied on the conductive layer. After the thickness of raised conductive layer 413 is reached, a dry film pattern image is applied on the conductive layer. This is build up to provide the basis for further etching of isolative regions such as gap 418. After the etching, the dry film can be striped and VSD materials 420 is bonded to the buildup structure, and further bonded to dielectric layer of 430.

Variations may be made to the shape and/or dimension of the raised structure. The raised structure 413 can be provided by a bump (i.e. contoured), a gradient of increasing thickness, or by step structure. In one embodiment, the raised structure may stem from a substantially flat portion 433 of the respective electrode 412. In particular, the raised structure 413 may stem from a substantially flat portion 433 of the respective electrode 412, meaning that (i) the thickness of the flat portion does not vary by more than 5% across that portion of the electrode 412, and (ii) the surface is unroughened or smooth. As a variation, the raised structure 413 may stem from a trough or valley. The raised structure 413 may have a thickness that exceeds that of the remaining portion of the respective electrode 412 (e.g. flat portion 433) by 10%, and in some variations, by more than 25% or 40%.

While an embodiment such as described provides for the raised structure (e.g. bump) to be formed from conductive material of the conductive layer, alternative embodiments may utilize different kinds of materials, including materials that have different conductive/resistive characteristics. Still further, in some embodiments, the raised structures may be formed from material that is not part of the substrate of the conductive layer. For example, the raised structures may be formed printed conductive material.

Figure 4B:
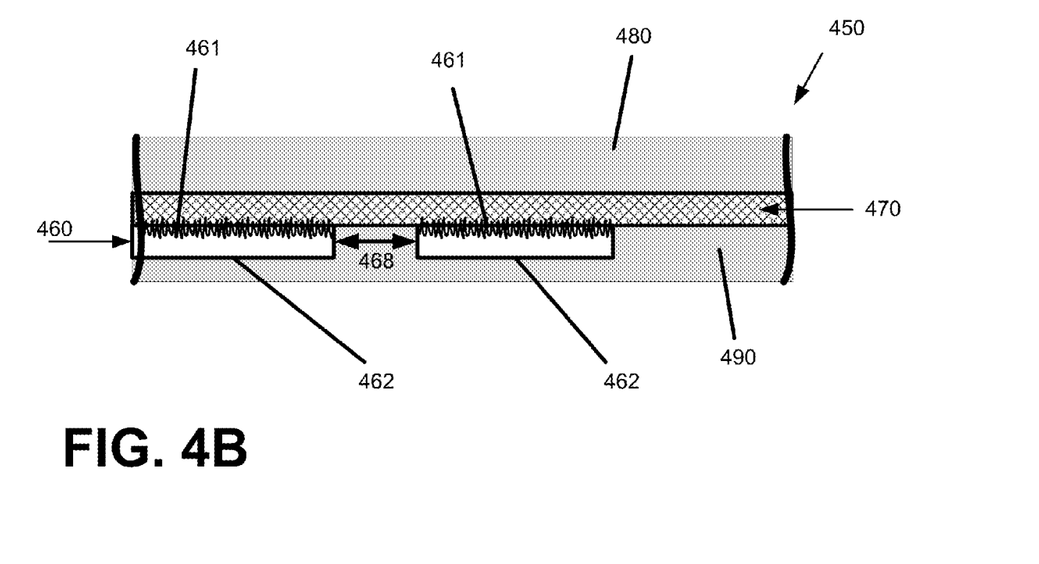
FIG. 4B illustrates an embodiment in which individual electrodes of a substrate are provided with rough surface topography.

Moreover, while a structure such as shown in FIG. 4A is effective in reducing the electric field "hot spots" when transient events occur, embodiments recognize that manufacturing tolerances may make the formation of the raised structures difficult to manufacture. FIG. 4B illustrates an embodiment in which individual electrodes of a substrate are provided with rough surface topography. More specifically, a substrate 450 includes a conductive layer 460 that is embedded in the substrate 450 (e.g. a core layer structure), similar to that shown with FIG. 2B. A layer of VSD material 470 directly overlays the conductive layer 460. A dielectric layer 480 (e.g. B-Stage material) overlays the layer VSD material 470. In an implementation shown, an additional dielectric layer 490 underlies the conductive layer 460. Adjacent electrodes 462 that comprise the conductive layer 460 are separated by a gap 468 that can be bridged when underlying material from the VSD layer 470 is switched into a conductive state (by a transient electrical event). Individual electrodes 462 of the conductive layer 460 are provided a rough surface topology 461. The rough surface topology 461 can be formed by roughening at least portions of individual electrodes 462 that comprise the conductive layer 460. Roughened electrodes 462 can be used in the core structure to reduce the amplitude of surge voltage at which transient material switch. As a result of being roughened, individual electrodes 462 of the conductive layer 460 includes peaks or raised structures that extend a thickness into the VSD material, similar to the configuration described with an embodiment of FIG. 4A. The roughening of the electrodes 462 can be performed by, for example, a chemical/mechanical etching step/process.

With reference to FIG. 4A and FIG. 4B, as mentioned, the more linear transient electrical path reduces the non-uniformness of the electric field that may otherwise result from the transient electrical event. The more uniform electric field enhances the electrical properties that are desired from the VSD material, including the magnitude of voltage or energy that can be handled by the material for a given thickness.

Interdisposed Resistive Layer

Figure 5A:
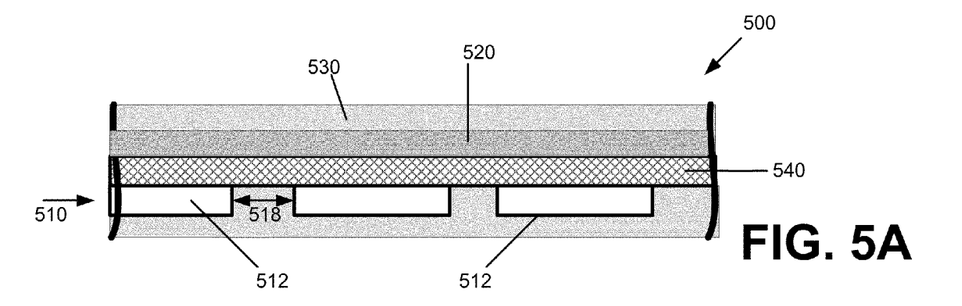
FIG. 5A is a schematic diagram that illustrates use of a resistive layer to enhance durability and electrical characteristics of a structure that includes transient protective material, according to an embodiment.

FIG. 5A is a diagram that illustrates use of a resistive layer to enhance durability and electrical characteristics of a structure that includes transient protective material. In more detail, a structure 500 includes a resistive layer 520 that is sandwiched between a conductive material layer 510 and a dielectric material layer 530 (e.g. B-stage). In some implementations, this layer may be patterned or semi-continuous. In comparison, FIG. 2B illustrates a stack comprising conductive layer, dielectric layer, and VSD layer. In an embodiment shown by FIG. 5A, resistive layer 520 is interdisposed between the layer of VSD layer 540 and dielectric layer 530. Similar to an embodiment of FIG. 2A and FIG. 2B, a conductive layer 510 is comprised of electrodes 512, that are spaced by gap 518. The VSD layer 540 is provided to bridge the two electrodes 512, 512 across gap 518 when a suitable electrical event occurs. Among other configurations, one of the electrodes 512 may interconnect or form part of a ground through use of a via or other conductive structure (not shown). The resistive layer 520 is formed from highly resistive material (e.g. material having a characteristic resistance that is of or greater than $10^6$ Ohm/m). The presence of the resistive layer 520 serves to protect the dielectric layer 530 from breaking down when transient and/or powerful electrical events occur. Additionally, when transient electrical events occur, the resistive layer 520 may facilitates linearizing the transient electrical path across the gap 518 of the two electrodes 512, 512.

In an embodiment, resistive layer 520 is bonded on one side with material that comprises the VSD layer 540. On the other side, the resistive layer 520 is bonded with the dielectric layer 530, which may comprise of B-stage material laminated under heat and pressure. According to embodiments, the resistive layer 520 is formed from any low conductivity metal, semiconductor, or polymer composite such as iron, silicon or metal particle filled polymer composites.

While FIG. 5A illustrates the layer of VSD material 540 being interdisposed between the resistive layer 520 and the conductive layer 510, in other implementations, resistive layer 520 may be bonded or coated to the conductive layer and to the layer of VSD material. In such an embodiment, the resistive layer may provide a filler for gap 518 so as to occupy at least a portion of the volume of the gap that separates electrodes 512, 512. For example, resistive layer 520 may be provided in place of the HBSLCD layer 570 of FIG. 5B. According to embodiments, the resistive layer 520 is formed from material that provides at least 100,000 Ohms resistance across the characteristic gap, and more preferably, at least 1 megaohm resistance across the characteristic gap.

Figure 5B:
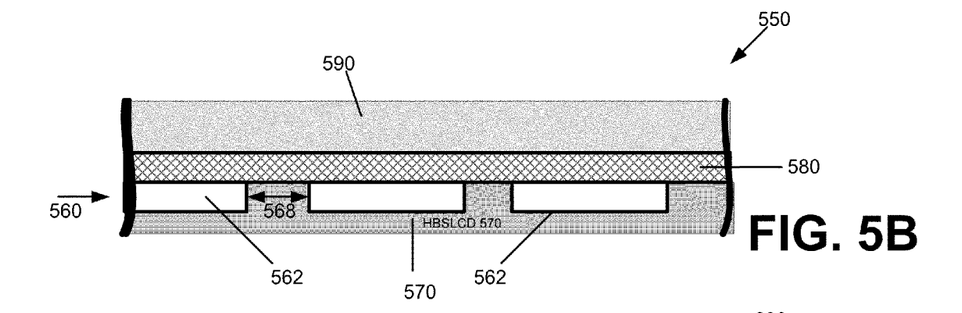
FIG. 5B illustrates an embodiment that utilizes a high breakdown strength and low conductivity dielectric layer.

As an alternative to a resistive layer, FIG. 5B illustrates an embodiment that utilizes a layer of high breakdown strength and low conductivity material (HBSLCD layer 570). According to embodiments as depicted, the HBSLCD layer 570 material is formed from material that (i) breaks down at voltages exceeding 500 volts/mil ($\frac{1}{1000}$ of inch), and (ii) conducts less than 10 nanoamps when subjected to voltage that is less than the breakdown. The following materials may be incorporated or used for HBSLCD layer 570. Examples of suitable materials include (i) BT Epoxy, manufactured as NELCO N5000, having electrical strength of 1200 volts/mil; (ii) FR4 Epoxy, manufactured under ISOLA 370HR, having electrical strength of 1350 volts/mil; and (iii) polymide, manufactured as RFLEX, having electrical strength of 8000 volts/mil. A structure 550 includes a HBSLCD layer 570 that is bonded, coated or otherwise layered into contact with a conductive layer 560 and a layer of VSD material 580. A dielectric layer 590 (e.g. B-stage) may be provided over the layer of VSD material 580. Similar to an embodiment of FIG. 2A and FIG. 2B, a conductive layer 560 is comprised of electrodes 562, that are spaced by gap 568. The VSD layer 580 is provided to bridge the two electrodes 562, 562 across gap 568 when a sufficient electrical event occurs (i.e. one providing voltage that exceeds the characteristic trigger voltage of the VSD material). Among other configurations, one of the electrodes 562 may interconnect or form part of a ground through use of a via or other conductive structure (not shown). In an embodiment shown by FIG. 5B, HBSLCD layer 570 is a filler for gap 568, so as to occupy at least a portion of the volume of the gap that separates the electrodes 562, 562.

In an alternative configuration, an embodiment provides for the HBSLCD layer 570 to be sandwiched between the conductive layer 560 and the dielectric layer 590. The HBSLCD layer 570 may be bonded, coated or positioned in direct contact (so as to be between) the layer of transient material 580 and the dielectric layer 590.

Interdisposed Conductive Material

Figure 6:
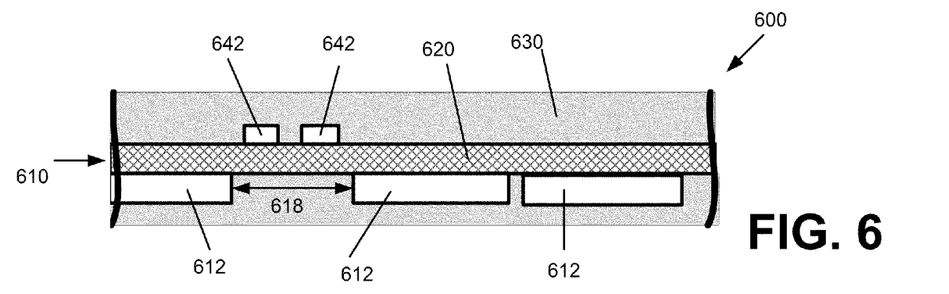
FIG. 6 illustrates a substrate that includes an additional formation of conductive material that is interdisposed between a layer of VSD material and a dielectric layer, according to an embodiment.
Figure 7:
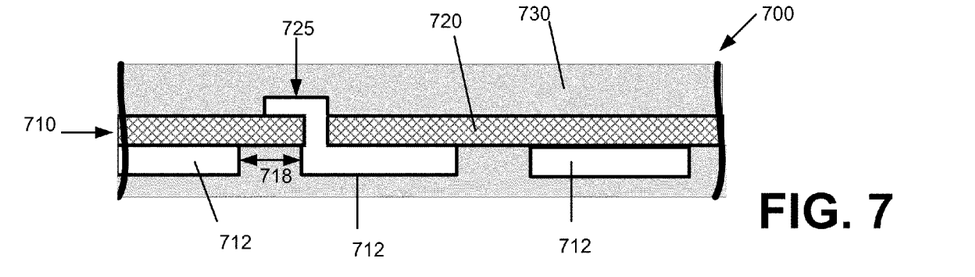
FIG. 7 illustrates a substrate that incorporates a shaped electrode in a horizontal switching arrangement with VSD material, according to an embodiment.

FIG. 6 and FIG. 7 each illustrate a substrate that includes an additional formation of conductive material that is interdisposed between a layer of VSD material and a dielectric layer, according to an embodiment. In an embodiment of FIG. 6, a structure 600 is provided in which selective deposits or formations of conductive material 642 are provided between a layer VSD material 620 and a layer of dielectric material 630 (e.g. B-stage). The formations of conductive material 642 ("conductive formations 642") can be formed with metal deposits. Separate from conductive formations 642, a conductive layer 610 includes electrodes 612, 612 that are separated by gap 618. The electrodes 612, 612 (e.g. pad and antipad or ground element) are provided in contact with the layer of VSD material 620, so that the VSD material bridges the electrodes 612, 612 when an electrical event occurs that exceeds the trigger voltage of the VSD material. Other layers such as described with any of the prior embodiments may be included as part of the substrate. In one implementation, dielectric layer 630 may be provided over the layer of VSD material 620. A resistive layer (not shown), such as described with an embodiment of FIG. 5A may also be included in the substrate. In an embodiment of FIG. 6, the conductive formations 642 are discrete and positioned between the dielectric layer 630 and the layer of VSD material 620. When an electrical event occurs (that supplies voltage in excess of the trigger voltage of the VSD material), each conductive formation 642 promotes linearization of the transient electrical path that extends to a corresponding one of the electrodes 612, 612 in the conductive layer 610. More specifically, the trigger voltage at which the VSD material 620 switches into a conductive state (and thus handle a surge voltage of a transient event) is based at least in part on (i) a thickness of the VSD material 620, and (ii) an area covered by the layer of VSD material 620. The presence of conductive formations 642 between the VSD material 620 and the conductive layer 610 assists linearization in that it shortens a transient electrical path that can form across the gap 618 when transient electrical events occur. As the conductive layer 642 has much higher conductivity then VSD material 620, the switch will occur in VSD material 620 that is provided between conductive layer 610 and conductive formation 642, and part of switch path regions in VSD material 620 are replaced by the conductive formation 642. Therefore, the path length inside VSD material 620 can be shorted by the appropriate choice of the length of conductive formation 642. The longer the length of conductive formation 642, the shorter the transient electrical path length within the layer of VSD material 620. The conductive formation 642 on top of the layer of VSD material 620 reduces the variation in the electric field values along the vertical direction within the thickness of the layer of VSD material, thus lessening (and therefore improving) the non-uniformity of electric field distribution when the transient electrical event occurs. In the configuration shown by FIG. 6, the transient electrical path is acutely angled with respect to the planar alignment of the gap structures (as provided by electrodes 612, 612). Thus, the presence of the conductive formations 642 linearizes the transient electrical path that interconnects the electrodes 612, 612. In this way, the conductive formations 642 reduce electric field variability across the gap 618. As another benefit, the use of discrete conductive formations 642 reduces the presence of leakage current, which can otherwise degrade performance of the VSD material when switching.

As an alternative or variation, the conductive material may be non-conductive, but more conductive than a standard dielectric.

FIG. 7 illustrates a substrate that incorporates a shaped electrode in a horizontal switching arrangement with VSD material, according to an embodiment. More specifically, according to an embodiment of FIG. 7, a shaped conductive element is positioned to shorten and linearize the transient electrical path that is formed when a layer of underlying VSD material bridges to electrodes in a gap formation. Substrate 700 includes a conductive layer 710 that comprises electrodes or other trace elements, including electrodes 712, 712 that are separated by gap 718. The electrodes 712, 712 (e.g. pad and antipad or ground element) are provided in contact with the layer of VSD material 720, so that the VSD material bridges the electrodes 712, 712 when an electrical event occurs that exceeds the trigger voltage of the VSD material. Other layers such as described with any of the prior embodiments may be included as part of the substrate. In one implementation, dielectric layer 730 may be provided over the layer of VSD material 720. A resistive layer (not shown in FIG. 7), such as described with an embodiment of FIG. 5A may also be included in the substrate. A shaped conductive element 725 is further provided to extend from one of the electrodes 712, 712 in the conductive layer 710. In an embodiment, the shaped conductive element 725 is shaped to extend vertically from the grounding electrode through at least a portion of the layer of VSD material 720. Furthermore, the shaped conductive element 725 is shaped to extend horizontally at least partially across the gap 718. As a variation, the shaped conductive element 725 may also extend completely across the gap 718 so as to form a vertical switching arrangement. Whether partially or fully extended across the gap 718, any transient electrical path that is to be formed across the gap 718 is linearized and shortened, thus reducing unwanted electrical field effects that may otherwise result when a transient electrical event occurs.

VSD Material Gap Filler

Figure 8:
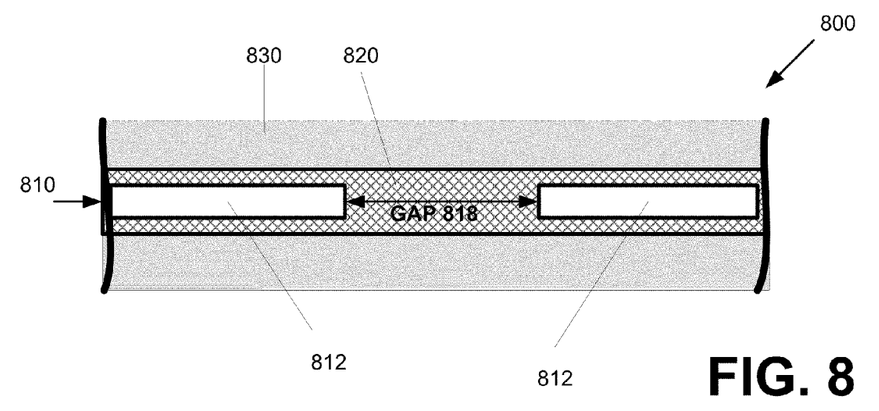
FIG. 8 illustrates a substrate that incorporates a horizontal gap formation that includes VSD material as gap filler, according to an embodiment.

FIG. 8 illustrates a substrate that incorporates a horizontal gap formation that includes VSD material as gap filler, according to an embodiment. A substrate 800 includes a conductive layer 810 comprised of electrodes 812, 812 that are separated by gap 818. In an embodiment shown, the layer of VSD material 820 (or other transient protective material) is positioned to occupy a volume that corresponds to the gap 818. As a gap filler, the VSD material is able to bridge the electrodes 812, 812 when an electrical event occurs that exceeds the trigger voltage of the VSD material. Other layers such as described with any of the prior embodiments may be included as part of the substrate. In one implementation, dielectric layer 830 may be provided over the layer of VSD material 820. A resistive layer, such as described with an embodiment of FIG. 5A may also be included in the substrate.

In one embodiment, the layer of VSD material 820 is formed as a combination of two layers that are deposited or formed on separate processes performed on different sides of the conductive layer. In one implementation, the conductive layer 810 is coated on one side with a first portion of the layer of VSD material 820. The conductive layer 810 (e.g. copper foil) can be etched with photo-lithography, so as to result in separated electrodes 812, 812. A second portion of the VSD material 820 is coated on the opposite side of the conductive layer 810. In one implementation, an etched copper foil is coated with VSD material, then is bonded to dielectric layers laminated under heat and pressure on both sides forming core layer structure. The VSD material is then deposited in the region across the via pad and via antipad.

In another embodiment, a layer of VSD material may be screen printed (or ink jet) on one side of the conductive layer, so the VSD material flows into the gap that separates the electrodes. Another layer of VSD material may be coated onto the other side of the conductive layers. Different compositions of VSD material may be used on each side of the conductive layer.

Intersecting VIA

Figure 9:
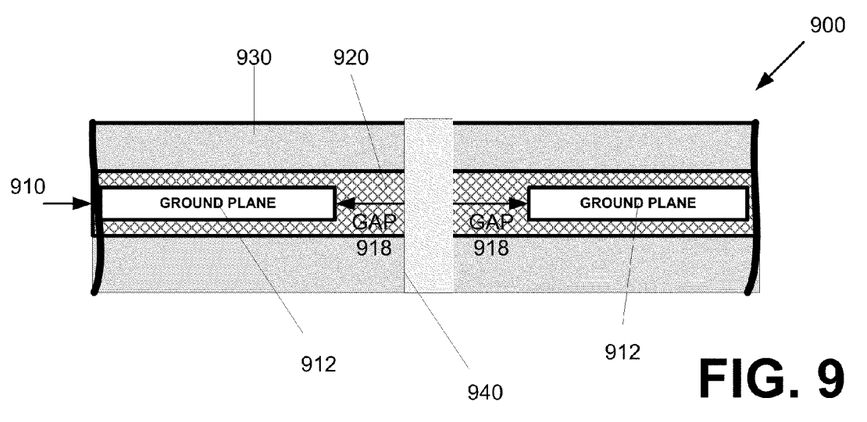
FIG. 9 illustrates a configuration in which a vertical conductive element intersects a gap formation that separates two electrodes of a grounding plane, according to an embodiment.

As an addition or alternative, FIG. 9 illustrates a configuration in which a vertical conductive element intersects a gap formation that separates two electrodes of a grounding plane. In more detail, substrate 900 includes a ground plane 910 comprised of ground electrodes 912, 912 that are separated by gap 918. An additional conductive layer (not shown) may also be provided. A layer of VSD material 920 (or other transient protective material) is overlaid onto the grounding plane, so as to be positioned to occupy a volume that corresponds to the gap 918. Other layers such as described with any of the prior embodiments may be included as part of the substrate. In one implementation, dielectric layer 930 may be provided over the layer of VSD material 920. A resistive layer, such as described with an embodiment of FIG. 5A may also be included in the substrate.

In an embodiment, a vertical conductive element 940 intersects the gap 918. The vertical conductive element 940 may interconnect with one or more conductive layers. When a transient electrical event occurs, the layer of VSD material is switched on, and the vertical conductive element 940 connects to the ground plane 910. By intersecting gap 918, the vertical conductive element linearizes the transient conductive path formed when the VSD material switches, thus reducing the unwanted electrical field effects resulting from the VSD material switching into the conductive state. In one implementation, the vertical conductive element 940 is a micro-via that intersects the gap 918.

VSD Material Patterning

Still further, some embodiments provide for patterning the layer of VSD material in a manner that enables transient electrical connectivity between opposing electrodes.

Embodiments described herein provide for a substrate that includes a formation of protective VSD material that is overlaid with an electrical trace or element, where the formation of VSD material is reduced by removal of some of the VSD material that would otherwise occupy the space underneath the trace element. The result is that the contact area between the VSD material and the trace element 130 is reduced, as compared to an overall footprint of the electrical trace as overlaid on the VSD formation.

According to one or more embodiments, an electrical trace is formed over a layer of VSD material. A quantity of the VSD material is then removed from the substrate to reduce the contact area between the VSD material and the trace element.

Figure 10A:
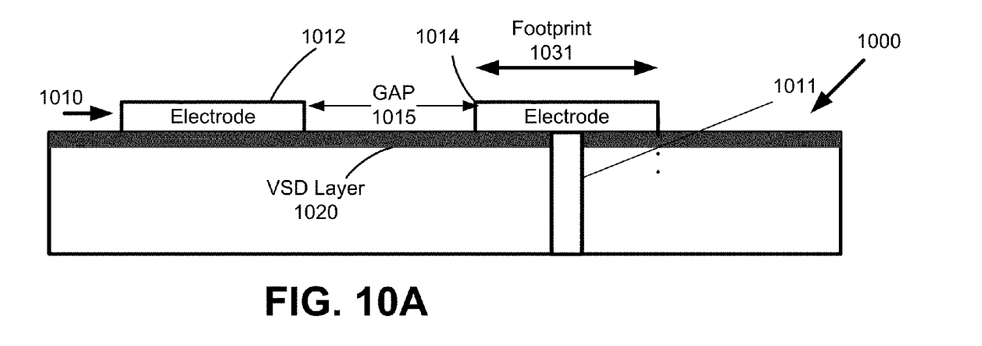
FIG. 10A and FIG. 10B illustrate variations to an embodiment in which a substrate incorporates a patterned layer of VSD material, according to one or more embodiments.

FIG. 10A illustrates a substrate that includes a patterned layer of VSD material, according to some embodiments. Substrate 1000 includes a layer of VSD material 1020 that is overlaid with electrodes 1012 (e.g. trace elements) that collectively form a conductive layer 1010. In a configuration shown, the electrodes 1012 are positioned to define a gap 1015 that separates a first electrode 1012 from a grounding electrode 1014. The VSD material 1020 is disposed under gap 1015 to bridge the electrodes when a transient electrical event exceeds the trigger voltage of the VSD material. The ground electrode 1014 occupies a footprint 1031 on the VSD layer 1020. The void 1011, however, extends through the layer of VSD material 1020 at a location that is overlaid by the electrode 1014. As a result, an overall contact area between the VSD layer 1020 and electrode 1014 is reduced as compared to the overall area that is otherwise possible within the footprint 1031.

Embodiments recognize that the presence of the VSD layer 1020 under the conductive layer 1010 can affect the capacitance of the individual electrodes 1012, 1012 that comprise the conductive layer. Accordingly, one or more embodiments recognize that the capacitance of the trace element may be manipulated or tuned by (i) removing VSD material from under a trace element that corresponds to one of the electrodes 1012, and optionally (ii) providing a filler material in place of the removed VSD material.

Figure 10B:
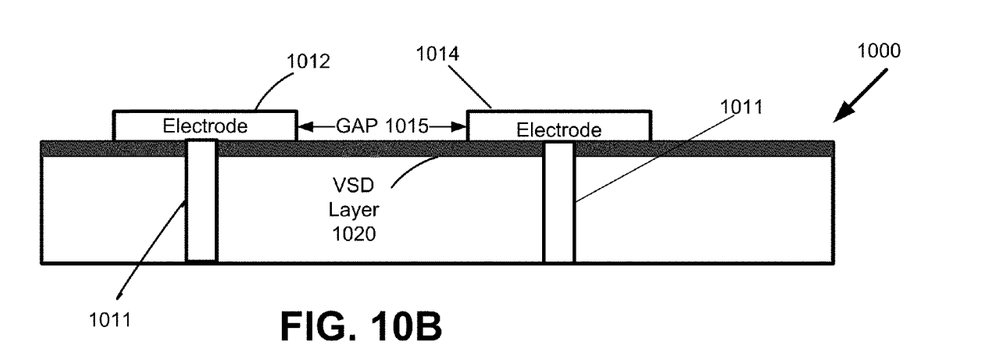

With reference to FIG. 10B, more than one electrode 1012, 1014 in the conductive layer may be affected by the formation of a partial void 1011 that results in removal of material from the VSD layer 1020 that underlies the individual electrodes.

According to an embodiment, the individual voids 1011, 1011 laser drilled into a backside of the substrate 1000. Other techniques, such as mechanical drilling or chemical mechanical polishing, may also be used in appropriate applications. The type of mechanism used to remove material from the VSD layer 1020, as well as the dimensions of the mechanism that performs the removal, may affect the profile of the removed section of VSD material. For example, the profile of the removed section may be made rounded or rough (e.g. See FIG. 10C), or more precise, depending on the tool used to remove material from the VSD layer 1020.

Still further, as another variant, more than one void may be formed into the substrate 110 to underlie a given electrode 1012, 1014. The amount of VSD material that is removed from under the electrodes, as well as the number of voids 1011, 1011 that are formed into the substrate to underlie the trace element (while providing sufficient amount of VSD material), may be limited by the size of the respective electrodes, and the ability to structurally and electrically support the individual electrodes.

Figure 10C:
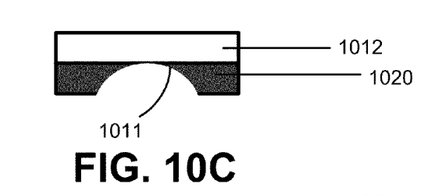
FIG. 10C illustrates a void that results in removal of VSD from the VSD layer under a location of an electrode or trace element, according to an embodiment.

FIG. 10C illustrates a void that results in removal of VSD from the VSD layer under a location of an electrode or trace element, according to an embodiment. The shape of the void 1011 formed in the layer of VSD material 1020 may vary depending on the process used to remove the VSD material. For example, a laser drill may result in a rounded removal. Some or all of the conductive material that comprises the electrode 1012 may be removed in the process as well.

Figure 11:
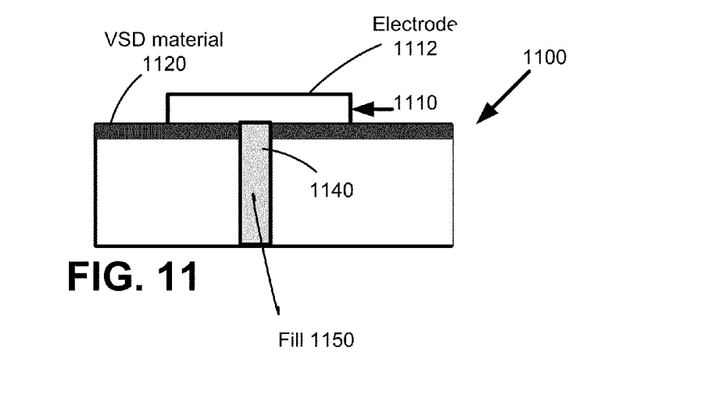
FIG. 11 shows a variation in which a void formed under an electrode of a conductive layer in a substrate is filled with select material, according to an embodiment.

FIG. 11 shows a variation in which a void formed under an electrode of a conductive layer in a substrate is filled with select material, according to an embodiment. FIG. 11 illustrates a substrate 1100 including a conductive layer 1110 comprised of individual electrodes 1112 (or electrodes). As described with an embodiment of FIG. 10A through FIG. 10C, a void 1140 is formed in the substrate to remove material from the VSD layer 1120 at a position that underlies one or more of the electrode 1112. In one implementation, a fill material 1150 is used to fill at least a portion of the void 1040. In one implementation, the fill material 1150 is provided as part of a lamination process. Alternatively, the void 1140 may be unfilled, or filled with other material that is selected to provide a desired characteristic. In one type of configuration, the filler 1150 is at least partially circumvented by the layer of VSD material that underlies the corresponding electrode 1112.

Under embodiments, the void 1140 is filled with material that affects the capacitance of the conductive material that comprises the electrode 1112. In one embodiment, the void 1140 is filled with material that lowers the overall dielectric constant of the trace element, or an affected region of the trace element. Alternatively, the void 1140 is filled with material 1150 that raises the capacitance of the affected region. Still further, the material 1150 for void 1140 may be selected to tune the capacitance of the substrate at the affected region. In one implementation, the filler 1150 is selected to tune the resonant frequency of a circuit that includes the material of the electrode 1112.

In this context, the filler 1150 is selected based in part on its dielectric constant. Examples of suitable material for use as filler 11150 include epoxy, ceramic, or ceramic composite.

Although illustrative embodiments have been described in detail herein with reference to the accompanying drawings, variations to specific embodiments and details are encompassed herein. It is intended that the scope of the invention is defined by the following claims and their equivalents. Furthermore, it is contemplated that a particular feature described, either individually or as part of an embodiment, can be combined with other individually described features, or parts of other embodiments. Thus, absence of describing combinations should not preclude the inventor(s) from claiming rights to such combinations.

What is claimed is:

1. A substrate device comprising:
   one or more layers of non-linear resistive transient protective material;
   a plurality of conductive elements distributed as part of a conductive layer of the substrate device so as to be in contact with at least one layer of the one or more layers of non-linear resistive transient protective material, the plurality of conductive elements including a pair of conductive elements that are spaced apart to form a gap, but which electrically connect when the transient protective material is conductive; and
   wherein at least one of the conductive elements of the pair of conductive elements includes one or more structural features that vary a thickness or topology of a portion of that conductive element, the portion contacting or extending into the at least one layer of the one or more layers of non-linear resistive transient protective material.

2. The substrate device of claim 1, wherein the one or more layers of non-linear resistive transient protective material comprises voltage switchable dielectric material.

3. The substrate device of claim 1, wherein at least one of the conductive elements of the pair of conductive elements includes one or more structural features that correspond to the at least one of the conductive elements of the pair of conductive elements having a raised portion.

4. The substrate device of claim 1, wherein at least one of the conductive elements of the pair of conductive elements includes one or more structural features that correspond to the at least one of the conductive elements of the pair of conductive elements having a roughened surface on at least a portion of the at least one of the conductive elements of the pair of conductive elements.

5. The substrate of claim 4, wherein the roughened surface is a result of a mechanical or chemical etching process performed on a portion of the conductive layer that includes at least one of the conductive elements of the pair of conductive elements.

6. The substrate device of claim 1, wherein at least one of the conductive elements of the pair of conductive elements includes one or more structural features that correspond to the at least one of the conductive elements of the pair of conductive elements having an extension that extends (i) at least partially through the at least one layer of the one or more layers of non-linear resistive transient protective material, and (ii) at least partially across the gap.

7. The substrate device of claim 1, further comprising one or more layers of dielectric material, including a layer of dielectric material that is in contact with conductive elements of the conductive layer.

8. The substrate device of claim 7, further comprising a layer of resistive material that is positioned between the conductive layer and the layer of dielectric material.

9. The substrate device of claim 8, wherein the layer of resistive material is comprised of a dielectric material.

10. The substrate device of claim 1, wherein the pair of conductive elements electrically connect using a transient electrical path, and wherein at least one of the conductive elements of the pair of conductive elements include one or more structural features such that the transient electrical path is caused to become substantially more linear relative to a structural feature not having the thickness or surface topology.

* * * * *